United States Patent
Chen

(10) Patent No.: US 11,678,551 B2
(45) Date of Patent: Jun. 13, 2023

(54) THREE-PANEL OLED DISPLAY STACK HAVING NON-OVERLAPPING PIXELS

(71) Applicant: WUHAN CHINA STAR OPTOELECTRONICS SEMICONDUCTOR DISPLAY TECHNOLOGY CO., LTD., Hubei (CN)

(72) Inventor: Jun Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 542 days.

(21) Appl. No.: 16/759,440

(22) PCT Filed: Apr. 13, 2020

(86) PCT No.: PCT/CN2020/084424
§ 371 (c)(1),
(2) Date: Apr. 27, 2020

(87) PCT Pub. No.: WO2021/174644
PCT Pub. Date: Sep. 10, 2021

(65) Prior Publication Data
US 2022/0320193 A1    Oct. 6, 2022

(30) Foreign Application Priority Data
Mar. 6, 2020    (CN) .......................... 202010151090.X

(51) Int. Cl.
*H10K 59/35*    (2023.01)
*H10K 50/84*    (2023.01)
(Continued)

(52) U.S. Cl.
CPC ......... *H10K 59/353* (2023.02); *H10K 50/818* (2023.02); *H10K 50/826* (2023.02);
(Continued)

(58) Field of Classification Search
CPC ............. H01L 27/3218; H01L 27/3267; H01L 51/5218; H01L 51/5231; H01L 51/5234; H01L 51/5237
(Continued)

(56) References Cited

U.S. PATENT DOCUMENTS

2002/0177007 A1    11/2002    Chernobrod et al.
2008/0136317 A1*   6/2008    Rogojevic ........... H01L 27/3209
                                                                    313/504
(Continued)

FOREIGN PATENT DOCUMENTS

CN    101601137 A    12/2009
CN    105428390 A    3/2016
(Continued)

*Primary Examiner* — Matthew E. Gordon
(74) *Attorney, Agent, or Firm* — PV IP PC; Wei Te Chung; Zhigang Ma

(57) ABSTRACT

The present invention discloses an organic light emitting diode display panel and a display device, by sequentially stacking three display panels from top to bottom, and disposing sub-pixels of a single color on each of the display panel, doubling a resolution of a screen of an organic light emitting diode display panel without increasing a density of a mask pixel and a density of elements of an array layer.

5 Claims, 2 Drawing Sheets

(51) Int. Cl.
*H10K 50/818* (2023.01)
*H10K 50/826* (2023.01)
*H10K 50/828* (2023.01)
*H10K 59/128* (2023.01)

(52) U.S. Cl.
CPC ............ *H10K 50/828* (2023.02); *H10K 50/84* (2023.02); *H10K 59/128* (2023.02)

(58) Field of Classification Search
USPC .......................................................... 257/40
See application file for complete search history.

(56) References Cited

U.S. PATENT DOCUMENTS

| | | |
|---|---|---|
| 2011/0115693 A1 | 5/2011 | Kim |
| 2014/0078126 A1 | 3/2014 | Hack et al. |
| 2014/0145161 A1 | 5/2014 | Naijo |
| 2014/0346477 A1 | 11/2014 | Chao et al. |
| 2016/0027859 A1 | 1/2016 | Kim et al. |
| 2016/0211484 A1 | 7/2016 | Naijo |
| 2017/0346043 A1 | 11/2017 | Lee et al. |
| 2019/0296264 A1 | 9/2019 | Mathai et al. |
| 2020/0168821 A1* | 5/2020 | Cao ..................... H01L 51/5253 |

FOREIGN PATENT DOCUMENTS

| | | | |
|---|---|---|---|
| CN | 107681040 A * | 2/2018 | ........... H01L 33/483 |
| CN | 107681040 A | 2/2018 | |
| CN | 108172694 A | 6/2018 | |
| CN | 108598120 A | 9/2018 | |
| CN | 208142183 U | 11/2018 | |
| CN | 109065572 A | 12/2018 | |
| CN | 109148545 A | 1/2019 | |
| CN | 109256410 A | 1/2019 | |
| CN | 109637387 A | 4/2019 | |
| CN | 109841747 A | 6/2019 | |

* cited by examiner

THREE-PANEL OLED DISPLAY STACK HAVING NON-OVERLAPPING PIXELS

The present invention claims the priority of a China patent application No. 202010151090.X with a subject title of the invention "ORGANIC LIGHT EMITTING DIODE DISPLAY PANEL AND DISPLAY DEVICE", which is filed on Mar. 6, 2020 with the China National Intellectual Property Administration (CNIPA), and contents of China patent application are integrated in the present invention by referring thereto.

FIELD OF INVENTION

The present invention relates to a field of display technologies, especially relates to an organic light emitting diode display panel and a display device.

BACKGROUND OF INVENTION

In recent years, organic light emitting diode (OLED) display technologies have developed promptly. OLED products have advantages of lightweight and compactness, fast responsive times, high contrasts, foldability, take more and more attention and applications, and are mainly applied to display fields such as cellular phones, tablets, televisions.

A mainstream OLED screen are 2K screens, and the display screens development trend heads to higher resolutions. The OLED screen, because of complicated array layers, a RGB evaporation type OLED screen also needs to use a fine mask, and it is difficult to enhance a density of pixels so a cost is high.

Therefore, a new design solution for a display panel to enhance the density of the pixels is required urgently.

SUMMARY OF INVENTION

Technical Issue

An embodiment of the present invention provides an organic light emitting diode display panel and a display device that are capable of effectively solve the issue that the cost of enhancement of pixels of a display panel is high and a fine mask is required.

Technical Solution

According to one aspect of the present invention, an embodiment of the present invention provides an organic light emitting diode (OLED) display panel, comprising: a first display panel, a second display panel, and a third display panel that are sequentially stacked on one another; wherein a plurality of first sub-pixels are disposed in the first display panel, a plurality of second sub-pixels are disposed in the second display panel, and a plurality of third sub-pixels are disposed in the third display panel; wherein light emitting directions of the first display panel, the second display panel, and the third display panel are consistent, and the first display panel and the second display panel are light transmissive.

Furthermore, an orthographic projection of each of the first sub-pixels, an orthographic projection of each of the second sub-pixels, and an orthographic projection of each of the third sub-pixels are not overlapped with one another in a level.

Furthermore, the third display panel comprises: a third thin film encapsulation layer; a reflection cathode layer disposed on the third thin film encapsulation layer; a third OLED layer disposed on the reflection cathode layer; a third array layer disposed on the third OLED layer; and a second light transmission substrate disposed on the third array layer.

Furthermore, the second display panel comprises: a second array layer disposed on the second light transmission substrate; a second OLED layer disposed on the second array layer; a second transparent cathode layer disposed on the second OLED layer; and a second thin film encapsulation layer disposed on the second transparent cathode layer.

Furthermore, the first display panel comprises: a first light transmission substrate; a first array layer disposed on the first light transmission substrate;
a first OLED layer disposed on the first array layer; a first transparent cathode layer disposed on the first OLED layer; and a first thin film encapsulation layer disposed on the first transparent cathode layer.

Furthermore, the system further comprises: a second reset status determination unit, configured to determine that a backlight is in a resettable status when the backlight is detected lighted.

Furthermore, the first sub-pixels in the first display panel comprise a single color, the second sub-pixels in the second display panel comprise a single color, and the third sub-pixels in the third display panel comprise a single color.

Furthermore, a second reflection anode layer is disposed in the second array layer, and a transparent anode layer is disposed in the third array layer.

Furthermore, an optical clear adhesive layer is sandwiched between the first display panel and the second display panel.

Furthermore, a first reflection anode layer is disposed in the first array layer.

According to another aspect of the present invention, an embodiment of the present invention provides a display device, comprising the organic light emitting diode display panel.

Advantages

Advantages of the present invention are that compared to the prior art, the present invention, by sequentially stacking three display panels from top to bottom, and disposing sub-pixels of a single color on each of the display panel, doubles a resolution of a screen of an organic light emitting diode display panel without increasing a density of a mask pixel (or no fine metal mask fine metal mask (FMM) is used) and a density of elements of an array layer.

DESCRIPTION OF DRAWINGS

Specific embodiments of the present invention are described in details with accompanying drawings as follows to make technical solutions and advantages of the present invention clear.

DETAILED DESCRIPTION OF PREFERRED EMBODIMENTS

Figure 1:
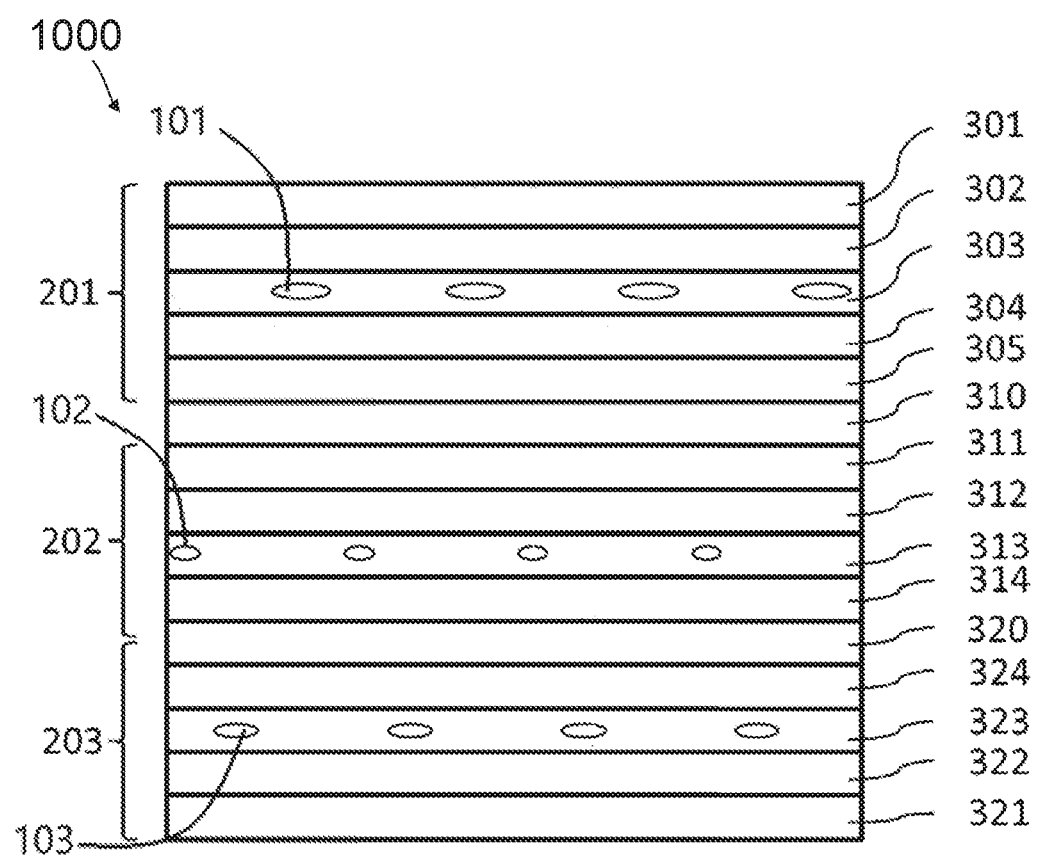
FIG. 1 is a schematic structural view of an organic light emitting diode display panel provided by an embodiment of the present invention.

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis. In the present embodiment, the simulation display touch unit is connected to the head tracking unit and is configured to acquire a moving path of a sensitive cursor in the display apparatus.

In the present invention, it should be noted that unless clear rules and limitations otherwise exist, words "a first feature is "on" or "under" a second feature" can include a direct contact of the first and second features, can also include a contact of the first and second features through another feature therebetween instead of a direct contact. Furthermore, words "the first feature is "above" or "over" the second feature include that the first feature is right above or obliquely above the second feature, or only indicate that a level of the first feature is higher that of the second feature. Words "the first feature is "under" or "below" the second feature include that the first feature is right under or obliquely under the second feature, or only indicate that the level of the first feature is lower than that of the second feature.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

With reference to FIG. 1, FIG. 1 is a schematic structural view of an organic light emitting diode display panel provided by an embodiment of the present invention. The organic light emitting diode display panel comprises: a first display panel 201, a second display panel 202, and a third display panel 203.

The organic light emitting diode display panel 1000 comprises the first display panel 201, the second display panel 202, and the third display panel 203 that are sequentially stacked on one another from top to bottom. Light emitting directions of the first display panel 201, the second display panel 202, and the third display panel 203 are consistent, and the first display panel 201 and the second display panel 202 are light transmissive.

Specifically, the third display panel 203 comprises: a third thin film encapsulation layer 321, a reflection cathode layer 322, a third OLED layer 323, a third array layer 324, and a second light transmission substrate 320. The OLED layer herein are is also called organic light emitting layer, as the following third OLED layer 323, second OLED layer 313, and first OLED layer 303.

In the present embodiment, the third thin film encapsulation layer 321 is an inorganic-organic-inorganic lamination structure. A material of the inorganic encapsulation layer can comprise an inorganic material, for example, silicon nitride, silicon oxide, and silicon oxynitride. Compactness of the inorganic material is high and can prevent invasion of water and oxygen. A material of the organic encapsulation layer can be a high polymer material including desiccant or a high polymer material capable of blocking water vapor, for example, high polymer resin, to planarize a surface of a display substrate and to ease a stress of the inorganic encapsulation layer, and can include a water absorptive material such as desiccant to absorb invading substance such as water and oxygen inside. Furthermore, a thickness of the third thin film encapsulation layer 321 can be 5-15 microns.

The reflection cathode layer 322 is disposed on the third thin film encapsulation layer 321.

In the present embodiment, a material of the reflection cathode layer 322 can be magnesium silver alloy, and a thickness of the reflection cathode layer 322 is 20-200 nanometers. An objective of disposing the reflection cathode layer is as follows. Because a light emitting direction of the organic light emitting diode display panel 1000 is from the third display panel 203 toward the first display panel 201, and a light emitting direction of the third display panel 203 is opposite to the light emitting direction of the organic light emitting diode display panel 1000, the reflection cathode layer 322 in the third display panel 203 can reflect the light to be consistent with the light emitting direction of the organic light emitting diode display panel 1000.

The third OLED layer 323 is disposed on the reflection cathode layer 322.

In the present embodiment, a thickness of the third OLED layer 323 is 50-400 nanometers. A plurality of third sub-pixels 103 are disposed in the third OLED layer 323. The third sub-pixels 101 are red sub-pixels but are not limited thereto. In other embodiment, the third sub-pixels 103 can also be green sub-pixels and blue sub-pixels.

The third array layer 324 is disposed on the third OLED layer 323.

In the present embodiment, a transparent anode layer is disposed in the third array layer 324, and the transparent anode layer is configured to be transmissive to light reflected back from the reflection cathode layer 322.

The second light transmission substrate 320 is disposed on the third array layer 324.

In the present embodiment, a material of the second light transmission substrate 320 comprises silicon nitride and silicon oxynitride to serve as a transparent second light transmission substrate, and a thickness of the second light transmission substrate 320 can be 8-30 microns.

The second display panel 202 comprises: a second array layer 314, a second OLED layer 313, a second transparent cathode layer 312, a second thin film encapsulation layer 311.

The second array layer 314 is disposed on the second light transmission substrate 320.

In the present embodiment, a second reflection anode layer is disposed in the second array layer 314, and the second reflection anode layer is configured to reflect a portion of light from the second display panel 202 to the first display panel 201.

The second OLED layer 313 is disposed on the second array layer 314.

In the present embodiment, a thickness of the second OLED layer 313 is 50-400 nanometers. A plurality of second sub-pixels 102 are disposed in the second OLED layer 313. The second sub-pixels 102 are green sub-pixels, but are not limited thereto. In other embodiment, the second sub-pixels 101 can also be red sub-pixels or blue sub-pixels.

The second transparent cathode layer 312 is disposed on the second OLED layer 313.

In the present embodiment, a material of the second transparent cathode layer 312 can be magnesium silver alloy, and a thickness of the second transparent cathode layer 312 can be 7-20 nanometers.

The second thin film encapsulation layer 311 is disposed on the second transparent cathode layer 312.

In the present embodiment, the second thin film encapsulation layer 311 is a inorganic-organic-inorganic lamination structure. A material of the inorganic encapsulation layer can comprise an inorganic material, for example, silicon nitride, silicon oxide, silicon oxynitride. Compactness of the inorganic material is high and can prevent invasion of water and oxygen. A material of the organic encapsulation layer can be a high polymer material including desiccant or a high polymer material capable of blocking water vapor, for example, high polymer resin, to planarize a surface of a display substrate and to ease a stress of the inorganic encapsulation layer, and can include a water absorptive material such as desiccant to absorb invading substance such as water and oxygen inside. Furthermore, a thickness of the second thin film encapsulation layer 311 is 5-15 microns.

The first display panel 201 comprises: a first light transmission substrate 305, a first array layer 304, a first OLED layer 303, a first transparent cathode layer 302, and a first thin film encapsulation layer 301.

In the present embodiment, an optical clear adhesive layer 310 is sandwiched between the first display panel 201 and the second display panel 202, and a thickness of the optical clear adhesive can be 0.5-5 microns.

A material of the first light transmission substrate 305 comprises silicon nitride and silicon oxynitride to serve as a transparent first light transmission substrate, and a thickness of the first light transmission substrate 305 is 8-30 microns.

The first array layer 304 is disposed on the first light transmission substrate 305.

In the present embodiment, a first reflection anode layer is disposed in the first array layer 304, and the first reflection anode layer is configured to reflect a portion of light from the first display panel 201 out.

The first OLED layer 303 is disposed on the first array layer 304.

In the present embodiment, a thickness of the first OLED layer 303 is 50-400 nanometers. a plurality of first sub-pixels 101 are disposed in the first OLED layer 303. The first sub-pixels 101 are blue sub-pixels, but are not limited thereto. In other embodiments, the first sub-pixels 101 can also be red sub-pixels or green sub-pixels.

The first transparent cathode layer 302 is disposed on the first OLED layer 303.

In the present embodiment, a material of the first transparent cathode layer 302 can be magnesium silver alloy, a thickness of the first transparent cathode layer 302 is 7-20 nanometers.

The first thin film encapsulation layer 301 is disposed on the first transparent cathode layer 302.

In the present embodiment, the first thin film encapsulation layer 301 is an inorganic-organic-inorganic lamination structure. A material of the inorganic encapsulation layer can comprise an inorganic material, for example, silicon nitride, silicon oxide, silicon oxynitride. Compactness of the inorganic material is high and can prevent invasion of water and oxygen. A material of the organic encapsulation layer can be a high polymer material including desiccant or a high polymer material capable of blocking water vapor, for example, high polymer resin, to planarize a surface of a display substrate and to ease a stress of the inorganic encapsulation layer, and can include a water absorptive material such as desiccant to absorb invading substance such as water and oxygen inside. Furthermore, a thickness of the first thin film encapsulation layer 301 is 5-15 microns.

In the present embodiment, an orthographic projection of each of the first sub-pixels 101, an orthographic projection of each of the second sub-pixels 102, and an orthographic projection of each of the third sub-pixels 103 are not overlapped with one another in a level. As such, the first sub-pixels, the second sub-pixels, and the third sub-pixels would not block one another from receiving light, which guarantees normal display of the organic light emitting diode display panel 1000.

In the present embodiment, the first sub-pixels 101 in the first display panel comprise a single color, the second sub-pixels 102 in the second display panel comprise a single color, and the third sub-pixels 103 in the third display panel comprise a single color. As such, it is convenient for unified production for enhancement of production rate.

Advantages of the present invention are that compared to the prior art, the present invention, by sequentially stacking three display panels from top to bottom, and disposing sub-pixels of a single color on each of the display panel, doubles a resolution of a screen of an organic light emitting diode display panel without increasing a density of a mask pixel (or no fine metal mask fine metal mask (FMM) is used) and a density of elements of an array layer.

Figure 2:
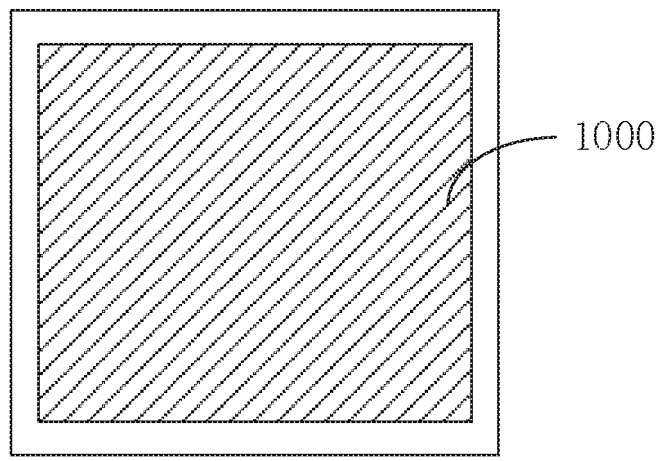
FIG. 2 is a schematic structural view of a display device provided by an embodiment of the present invention.

With reference to FIG. 2, FIG. 2 is a schematic structural view of a display device provided by an embodiment of the present invention. The display device comprises the organic light emitting diode display panel 1000 of the above embodiment. The display device can be any product or component with display functions such as a liquid crystal television (TV), a liquid crystal display device (for example, a flexible display, a high efficiency display), a cell phone, a digital picture frame, and a tablet.

In the above-mentioned embodiments, the descriptions of the various embodiments are focused. For the details of the embodiments not described, reference may be made to the related descriptions of the other embodiments.

The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. An organic light emitting diode (OLED) display panel, comprising:
    a first display panel, a second display panel, and a third display panel that are sequentially stacked on one another;
    wherein a plurality of first sub-pixels are disposed in the first display panel, a plurality of second sub-pixels are disposed in the second display panel, and a plurality of third sub-pixels are disposed in the third display panel;
    wherein light emitting directions of the first display panel, the second display panel, and the third display panel are consistent, and the first display panel and the second display panel are light transmissive;
    wherein the third display panel comprises:
        a third thin film encapsulation layer;
        a reflection cathode layer disposed on the third thin film encapsulation layer;
        a third OLED layer disposed on the reflection cathode layer;
        a third array layer disposed on the third OLED layer; and
        a second light transmission substrate disposed on the third array layer;
    wherein the second display panel comprises:
        a second array layer disposed on the second light transmission substrate;
        a second OLED layer disposed on the second array layer;
        a second transparent cathode layer disposed on the second OLED layer; and
        a second thin film encapsulation layer disposed on the second transparent cathode layer;
    wherein the first display panel comprises:
        a first light transmission substrate;
        a first array layer disposed on the first light transmission substrate;
        a first OLED layer disposed on the first array layer;
        a first transparent cathode layer disposed on the first OLED layer; and
        a first thin film encapsulation layer disposed on the first transparent cathode layer;
    wherein the second transparent cathode layer is located between the reflection cathode layer and the first transparent cathode layer.

2. The OLED display panel as claimed in claim 1, wherein an orthographic projection of each of the first sub-pixels, an orthographic projection of each of the second sub-pixels, and an orthographic projection of each of the third sub-pixels are not overlapped with one another in a level.

3. The OLED display panel as claimed in claim 1, wherein the first sub-pixels in the first display panel comprise a single color, the second sub-pixels in the second display panel comprise a single color, and the third sub-pixels in the third display panel comprise a single color.

4. The OLED display panel as claimed in claim 1, wherein an optical clear adhesive layer is sandwiched between the first display panel and the second display panel.

5. A display device, comprising the OLED display panel as claimed in claim 1.

* * * * *